United States Patent
Horne et al.

(10) Patent No.: US 6,701,280 B2
(45) Date of Patent: Mar. 2, 2004

(54) SYSTEM AND METHOD TO PROVIDE MEASUREMENT CAPABILITIES FOR BOTH SINGLE-ENDED AND DIFFERENTIAL SIGNALS WITH SOFTWARE SWITCHING

(75) Inventors: Steven Horne, El Granada, CA (US); Shalom Kattan, Campbell, CA (US)

(73) Assignee: Guide Technology, Sunnyvale, CA (US)

(*) Notice: Subject to any disclaimer, the term of this patent is extended or adjusted under 35 U.S.C. 154(b) by 0 days.

(21) Appl. No.: 10/105,007

(22) Filed: Mar. 22, 2002

(65) Prior Publication Data

US 2003/0182079 A1 Sep. 25, 2003

(51) Int. Cl.[7] .................................................. G04F 8/00
(52) U.S. Cl. ..................... 702/177; 327/108; 341/159; 368/113; 368/121; 702/69
(58) Field of Search ............................ 702/60, 69, 117, 702/176, 177–178, 180; 341/159; 327/108, 132; 310/68; 377/20; 368/113, 121; 435/29

(56) References Cited

U.S. PATENT DOCUMENTS

| | | | |
|---|---|---|---|
| 4,757,452 A | | 7/1988 | Scott et al. ................. 702/69 |
| 5,430,400 A | * | 7/1995 | Herlein et al. ............. 327/108 |
| 5,936,566 A | * | 8/1999 | Park ........................... 341/159 |
| 6,091,671 A | | 7/2000 | Kattan ......................... 368/113 |
| 6,181,649 B1 | | 1/2001 | Kattan ......................... 368/121 |
| 6,185,509 B1 | | 2/2001 | Wilstrup et al. ............. 702/69 |
| 6,194,925 B1 | | 2/2001 | Kimsal et al. ............... 327/132 |
| 6,226,231 B1 | | 5/2001 | Kattan ......................... 368/113 |
| 6,298,315 B1 | | 10/2001 | Li et al. ...................... 702/180 |
| 6,356,850 B1 | | 3/2002 | Wilstrup et al. ............. 702/69 |
| 6,384,496 B1 | | 5/2002 | Pyntikov et al. ........... 310/68 B |
| 6,393,088 B1 | | 5/2002 | Emineth et al. ............. 377/20 |

OTHER PUBLICATIONS

U.S. Patent Application Publication No. US 2001/0028262 A1, Publication Date Oct. 11, 2001, Kimsal, et al.
U.S. Patent Application Publication No. US2001/0044704A1, Publication Date Nov. 22, 2001, Li, et al.

* cited by examiner

*Primary Examiner*—Bryan Bui
*Assistant Examiner*—John Le
(74) *Attorney, Agent, or Firm*—Dority & Manning, P.A.

(57) ABSTRACT

Improved input circuitry for use in conjunction with measurement devices is disclosed. The subject input circuitry enables a single measurement device to take measurements on both single-ended and differential signal inputs. Software-implemented control signals can be programmed by a user or set to default values to select which type of input signal is to be measured. The input circuitry minimizes the use of electromechanical relays and other components or phenomena that may degrade the quality of the input signals, and also includes resistor networks to additionally help maintain signal integrity. A plurality of common programmable voltage sources is provided for use in accordance with select embodiments of the disclosed technology to serve as either termination voltages, threshold voltages, or both. Both three-comparator and five-comparator input circuit configurations are presented to display the versatility in implementing aspects of the present subject matter and to offer options for reduced component count and other advantages.

30 Claims, 7 Drawing Sheets

SYSTEM AND METHOD TO PROVIDE MEASUREMENT CAPABILITIES FOR BOTH SINGLE-ENDED AND DIFFERENTIAL SIGNALS WITH SOFTWARE SWITCHING

BACKGROUND OF THE INVENTION

In general, an integrated circuit refers to an electrical circuit contained on a single monolithic chip containing active and passive circuit elements. As should be well understood in this art, integrated circuits are fabricated by diffusing and depositing successive layers of various materials in a preselected pattern on a substrate. The materials can include semiconductive materials such as silicon, conductive materials such as metals, and low dielectric materials such as silicon dioxide. The semiconductive materials contained in integrated circuit chips are used to form almost all of the ordinary electronic circuit elements, such as resistors, capacitors, diodes, and transistors.

Integrated circuits are used in great quantities in electronic devices such as digital computers because of their small size, low power consumption and high reliability. The complexity of integrated circuits ranges from simple logic gates and memory units to large arrays capable of complete video, audio and print data processing. Presently, however, there is a demand for integrated circuit chips to accomplish more tasks in a smaller space while having even lower operating voltage and power requirements.

Currently, the semiconductor industry is focusing its efforts on reducing dimensions within each individual integrated circuit in order to increase speed and to reduce energy requirements. The demand for faster and more efficient circuits, however, has created various problems for circuit manufacturers. For instance, a unique problem has emerged in developing equipment capable of characterizing, evaluating and testing faster chips. Timing errors and pulse width deviations may constitute a greater portion of a signal period at higher frequencies. As such, a need exists not only for devices capable of detecting these errors but also devices capable of characterizing and identifying these critical timing deviations.

In the past, electronic measurement devices have been used to test integrated circuits for timing irregularities by making frequency and period measurements of a signal output from the circuit. Certain devices, known as time interval analyzers or time counters, can perform time interval measurements, i.e. measurements of the time period between two input signal events, or can obtain other time characterizations of an input signal. A signal timing event is typically defined as the specific instant in time at which an input signal reaches a certain predefined level, also known as the threshold voltage level. At the specific time when the input signal crosses the threshold voltage level, a signal timing event occurs.

A time interval analyzer generally includes a continuous running clock and a continuous event counter. Typically, the device includes one or more timing measurement circuits on each of a plurality of measurement channels. Each measurement channel receives an input signal. By directing the signal across the channel to a given number of measurement circuits, known as interpolators, the device is able to measure the time interval between two events in the signals. Such devices are capable of making millions of measurements per second.

An alternative device for measuring timing parameters is a counter-based system. Similar to some extent to the time interval analyzer, a counter-based system measures the time period between two signal events using a clock that starts and then stops upon the respective signal events.

By measuring certain characteristics of a signal emitted by an integrated circuit, time interval analyzers and counter-based measurement devices can be used to detect timing errors or deviations that may be present within the circuit. This information can then be used to assist in developing an integrated circuit or for detecting defects in mass-produced circuits.

Timing fluctuations in integrated circuit signals are generally referred to as "jitter". Jitter, broadly defined as a timing deviation between a real pulse train and an ideal pulse train, can be a deviation in phase and/or pulse width. Jitter typically refers to small variations caused by supply voltage fluctuations, control-system instability, temperature variation, noise and the like.

Instruments such as time interval analyzers, counter-based measurement devices and oscilloscopes have been used to measure jitter. In particular, time interval analyzers can monitor frequency changes and frequency deviation over time. In this manner, they not only detect jitter, but can also characterize jitter so that its source can be determined.

Further, devices such as time interval analyzers may be used to monitor single-ended or differential signals. Generally, single-ended signals are carried on a single cable and are referenced to ground or some other fixed voltage. Differential signals are carried on two cables and are referenced against each other. It may often be the case that the two signals are complements of each other. These two types of signals, single-ended and differential, have typically been monitored by distinctly configured pieces of equipment since each signal type requires a different type of input circuit and number of cables to detect it. Past measurement devices have thus typically been hard-wired during their manufacture for measurement of either single-ended or differential signals.

One possible way to switch between single-ended and differential signal inputs is by using a combination of electromechanical relays at the input to a time measurement device. However, relays within a signal path tend to introduce undesired capacitance to the signal path and often degrade high frequency performance of testing equipment. Thus, testing equipment with a minimum number of electromechanical relays in the input signal paths is highly desired.

As integrated circuits have grown more advanced, the need for differential signal measurements has grown. At the same time, the need to maintain the capability for single-ended measurement has remained. As a result, there is a need for a device capable of switching between single-ended and differential measurement modes that minimizes the number of component parts, as well as the number of relays in the path of the input signal.

In addition, most output signals from older generation integrated circuits emitted older digital signals where a binary "0" was a voltage between about 0 to 0.7 and binary "1" was about 4 to 5 volts. To test such signals, a simple single-ended input circuit with a single termination resistor to ground (0 volts) was used. In accordance with more modem technologies, output signals now exist with different voltage levels to represent logical "0" and "1". For example, an LVDS output has logical "0" of 2.4 volts and logical "1" of 3.0 volts. In this case, the ideal input circuit would comprise a termination resistor connected to the range between logical "0" and "1", such as 2.7 volts. So it is desired, for automatic test equipment to have an input termination voltage that is programmable by the user.

In addition, certain differential signals often need to be analyzed in a variety of fashions. One measurement mode involves comparing a differential signal against another differential signal such that the time difference between respective cross-over points can be determined. Another measurement mode involves measuring corresponding portions of a single signal in a differential pair to characterize rise time, fall time, undershoot and overshoot. Since individual signals in a differential pair may typically be related to each other, additional characterization of the levels of similarity between the two signals in the pair may also be desired. Due to the many types of desired measurements, it is preferred to have a time measurement unit, such as a time interval analyzer or a time counter, that is capable of measuring a differential signal in a differential fashion, and immediately thereafter in a single-ended fashion with a very close time interval between the two types of measurements. Such an application imposes the need to be able to switch the measurement input circuit from one measurement type to the next very quickly, preferably on the order of less than a few microseconds.

BRIEF SUMMARY OF THE INVENTION

In view of the recognized features encountered in the prior art and addressed by the present subject matter, specialized measurement input circuitry has been developed. In general, such measurement circuitry provides a way to enable a single time measurement device to measure characteristics of both single-ended and differential input signals. This is preferably achieved in accordance with the disclosed circuitry via software-implemented toggling of different measurement modes at the direction of a user. Toggling between different measurement modes is preferably achieved in accordance with the present technology within a time no greater than a few microseconds. Varied exemplary embodiments of such measurement circuitry are hereafter presented, selected of which offer such advantages as minimized signal degradation and reduced component part.

One exemplary embodiment of the present subject matter relates to a time measurement device capable of measuring both single-ended and differential signal inputs. The time measurement device preferably includes measurement circuitry for obtaining timing information about selected input signals as well as input circuitry for selecting the input signals for which to obtain timing information. The input circuitry preferably comprises a plurality of dual-input, single-output comparators and a plurality of software driven selection devices. Input signals are selectively provided to both comparator inputs and a comparator output signal is provided from each of the plurality of comparators. Each selection device receives a comparator output signal from each of the dual-input, single-output or complementary dual output comparators and subsequently outputs a selected signal to the measurement circuitry based on software selection inputs to the selection devices.

The aforementioned input circuitry is preferably utilized to enable the measurement of single-ended and differential input signals by time measurement circuitry. More particular exemplary embodiments of the input circuitry correspond to either three-comparator or five-comparator configurations. Additional resistive networks may be provided before each comparator to isolate an input signal from input impedance of other comparators in the input circuitry. The selection devices which receive outputs from each comparator may preferably comprise multiplexors. In such case, the multiplexor input signals include an output signal from each comparator and the multiplexor control signals correspond to software selection inputs.

Embodiments of the disclosed input circuitry may be provided as the input to measurement channels in a time interval analyzer. The input circuitry receives an input signal and converts it to a timing signal based in part on the software selection of measurement mode types. Each measurement channel contains at least one interpolator for receiving the timing signal and obtaining a measurement corresponding to a selected transitions within its received timing signal. The resultant measurement information obtained by the interpolator can be directed to other components in the time interval analyzer for proper recording and storing of the measurement information.

Additional embodiments of the present subject matter concern methodology in accordance with obtaining both single-ended and differential signal measurements. One exemplary embodiment of such methodology concerns a selection method for determining whether measurement circuitry is to obtain timing measurements corresponding to single-ended input signals or to differential input signals. This may be done by providing programmable threshold voltages and, when necessary, programmable termination voltages to the input signal sources. More particularly, a first step in such a selection method is to selectively provide at least two input signals to a plurality of comparators, wherein each comparator is characterized by first and second inputs and an output. A plurality of programmable voltage sources may then be provided to each first and second input of the plurality of comparators that are not selectively connected to one of the two input signals. A plurality of selection devices is also provided, each for receiving comparator outputs from selected comparators and for receiving user-defined input for determining which of the received comparator outputs will be sent to the measurement circuitry such that timing measurements related to the comparator outputs can be obtained. Depending on the type of signal to be measured, the voltage sources are used for either termination or threshold purposes without the need for any electromechanical switches.

The accompanying drawings, which are incorporated in and constitute a part of this specification, illustrate one or more embodiments of the present subject matter, and together with the description serve to explain certain principles of the disclosed technology. Additional embodiments of the present subject matter may incorporate various steps or features of the above-referenced embodiments, and the scope of the presently disclosed technology should in no way be limited to any particular embodiment. Additional objects, features and aspects of the present subject matter and corresponding embodiments are discussed in greater detail below.

BRIEF DESCRIPTION OF THE DRAWINGS

A full and enabling disclosure of the present subject matter, including the best mode thereof, directed to one of ordinary skill in the art, is set forth in the specification, which makes reference to the appended drawings, in which.

Figure 1:
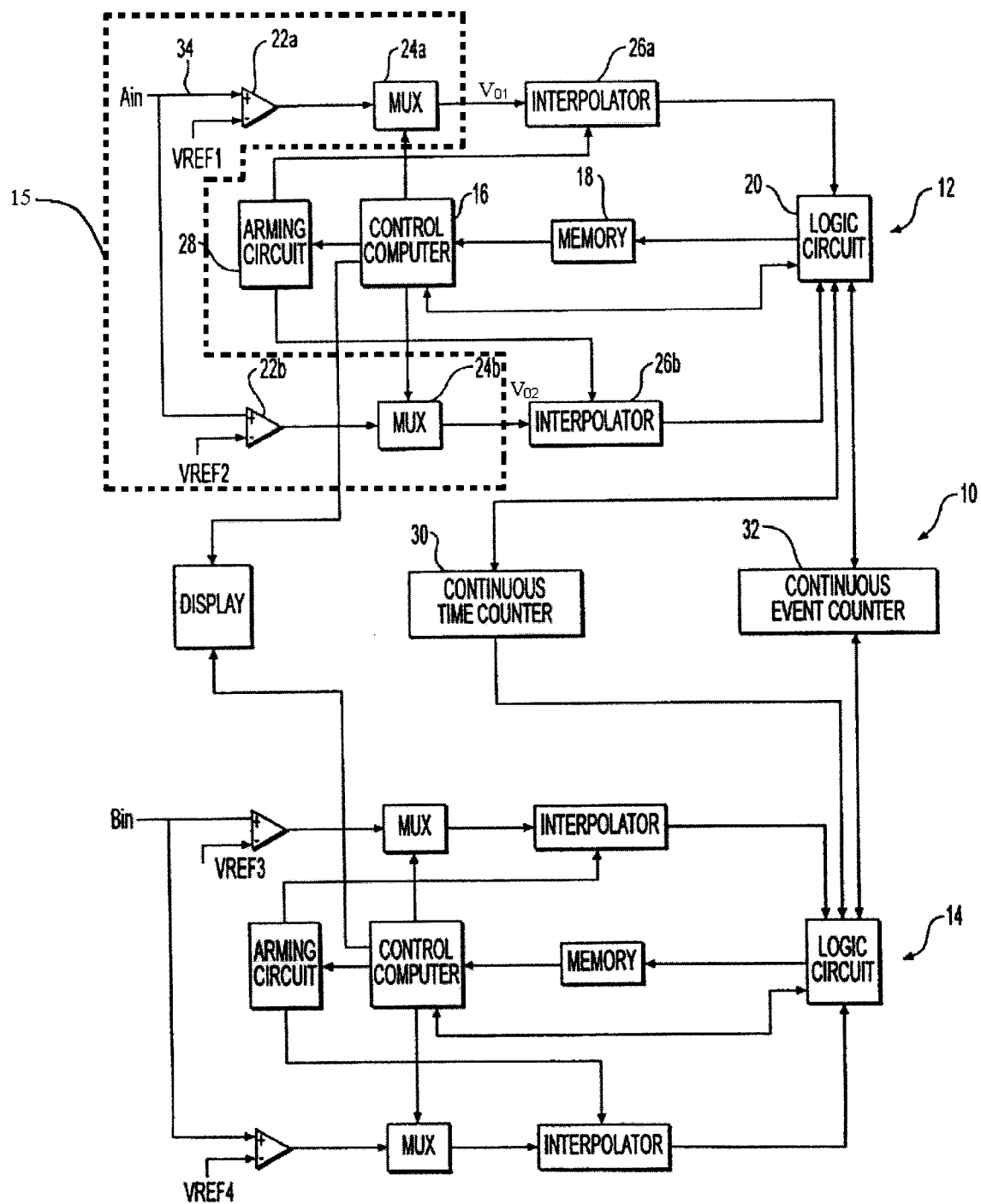
FIG. 1 is a block diagram of an exemplary time measurement device for measuring single-ended input signals.

Repeat use of reference characters in the present specification and drawings is intended to represent same or analogous features or elements of the present subject matter.

DETAILED DESCRIPTION OF EXEMPLARY EMBODIMENTS

Reference will now be made in detail to presently preferred embodiments of the disclosed technology, one or more examples of which are illustrated in the accompanying drawings. Each example is provided by way of explanation of the present technology, not limitation of the present technology. In fact, it will be apparent to those skilled in the art that modifications and variations can be made in the present technology without departing from the scope and spirit thereof. For instance, features illustrated or described as part of one embodiment may be used on another embodiment to yield a still further embodiment. Thus, it is intended that the present subject matter covers such modifications and variations as come within the scope of the appended claims and their equivalents.

Figure 2:
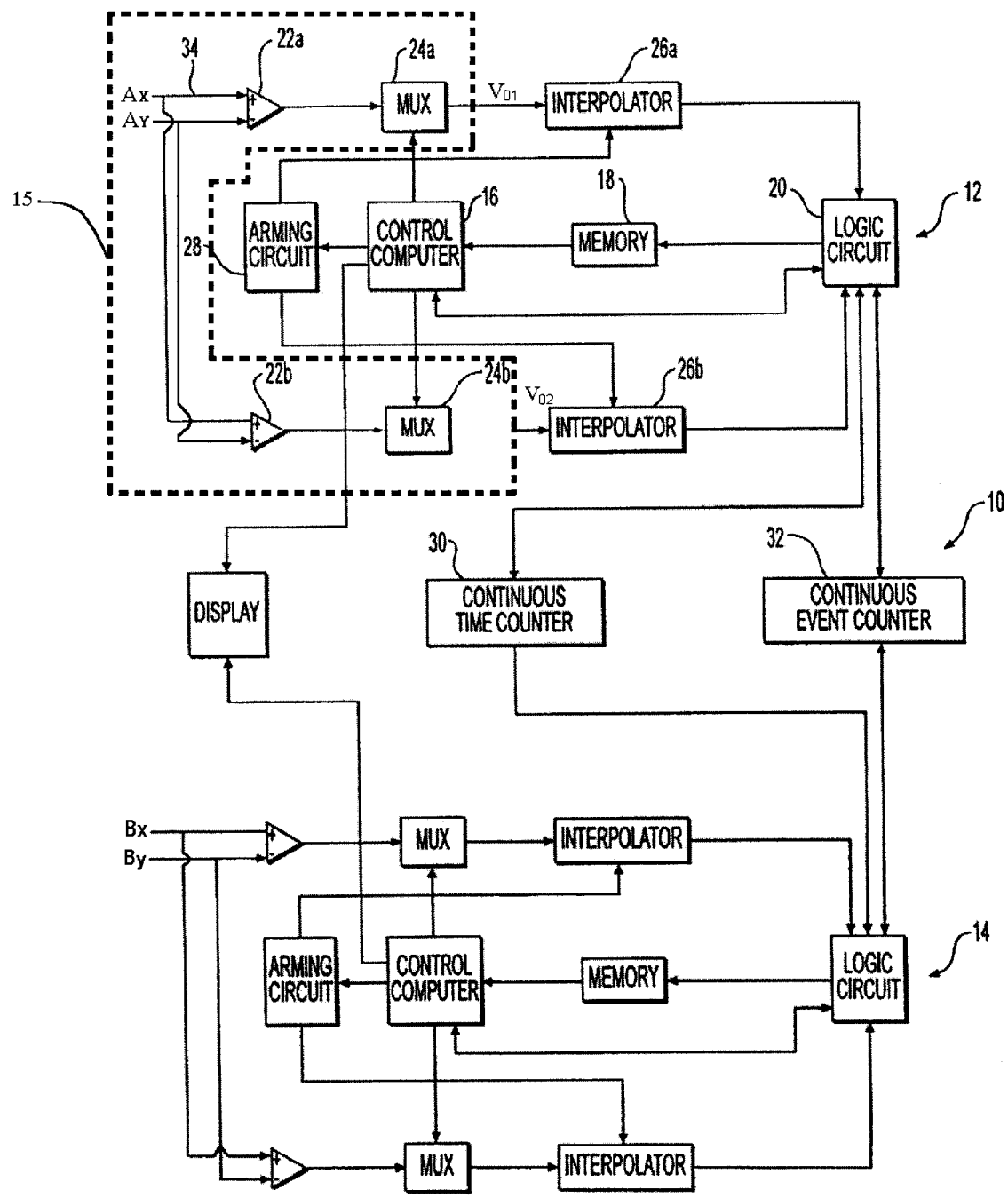
FIG. 2 is a block diagram of an exemplary time measurement device for measuring differential input signals.

As indicated in the Brief Summary of the Invention section above, the present subject matter is directed to input circuitry for use in accordance with measurement devices. FIGS. 1 and 2 display existing input circuitry that has been utilized with known time measurement devices for measuring single-ended and differential signal inputs, respectively. FIG. 1 displays single-ended input circuitry that may be used in accordance with obtaining signal measurements by comparison of a single-ended input against either one or two threshold voltages VREF1 and VREF2. FIG. 2 displays differential input circuitry that may be used in accordance with obtaining various signal measurements by comparison of differential signal inputs against each other.

Figure 3:
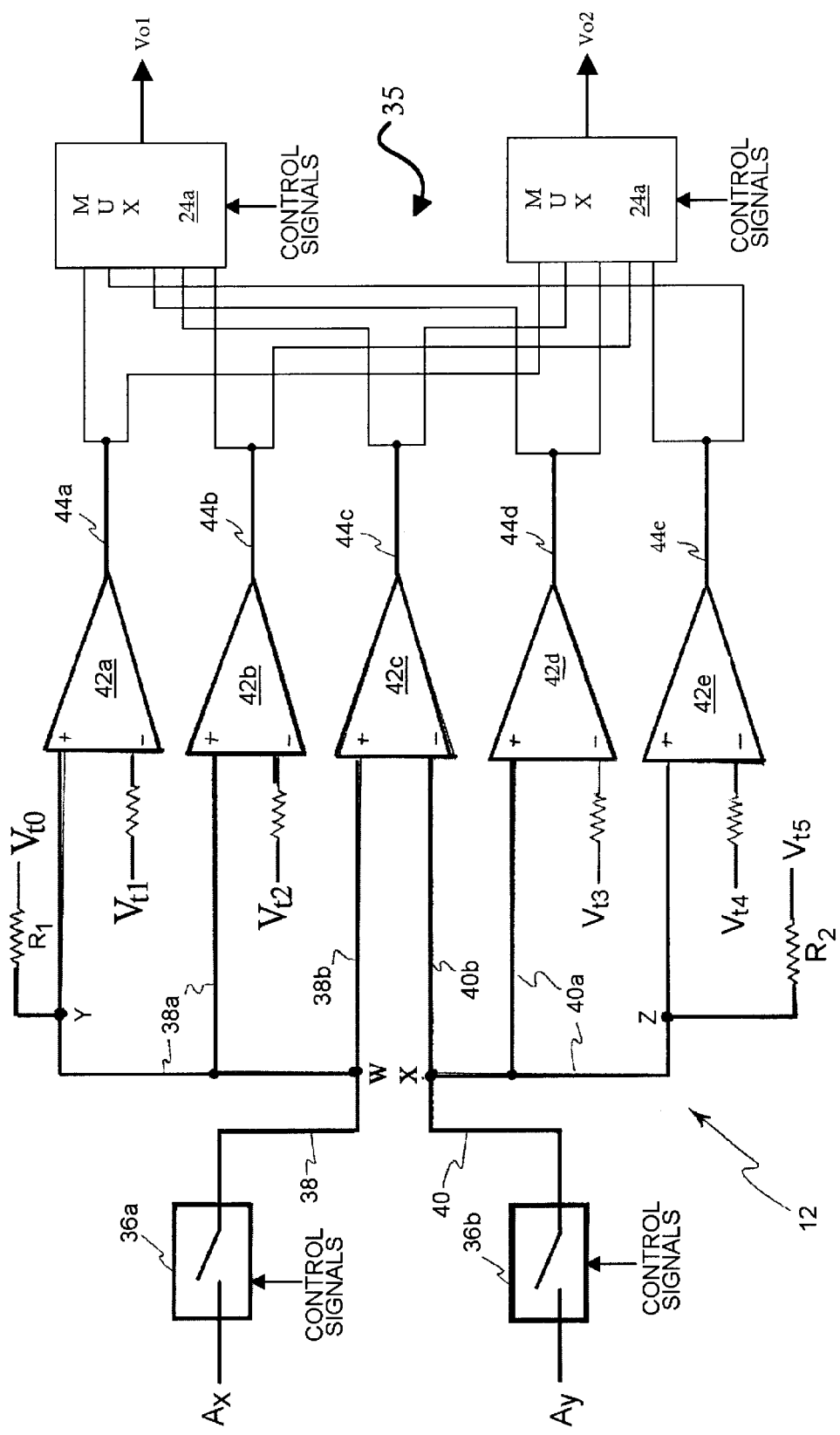
FIG. 3 illustrates an exemplary embodiment of input circuitry for use with a time measurement device in accordance with the presently disclosed technology.
Figure 4:
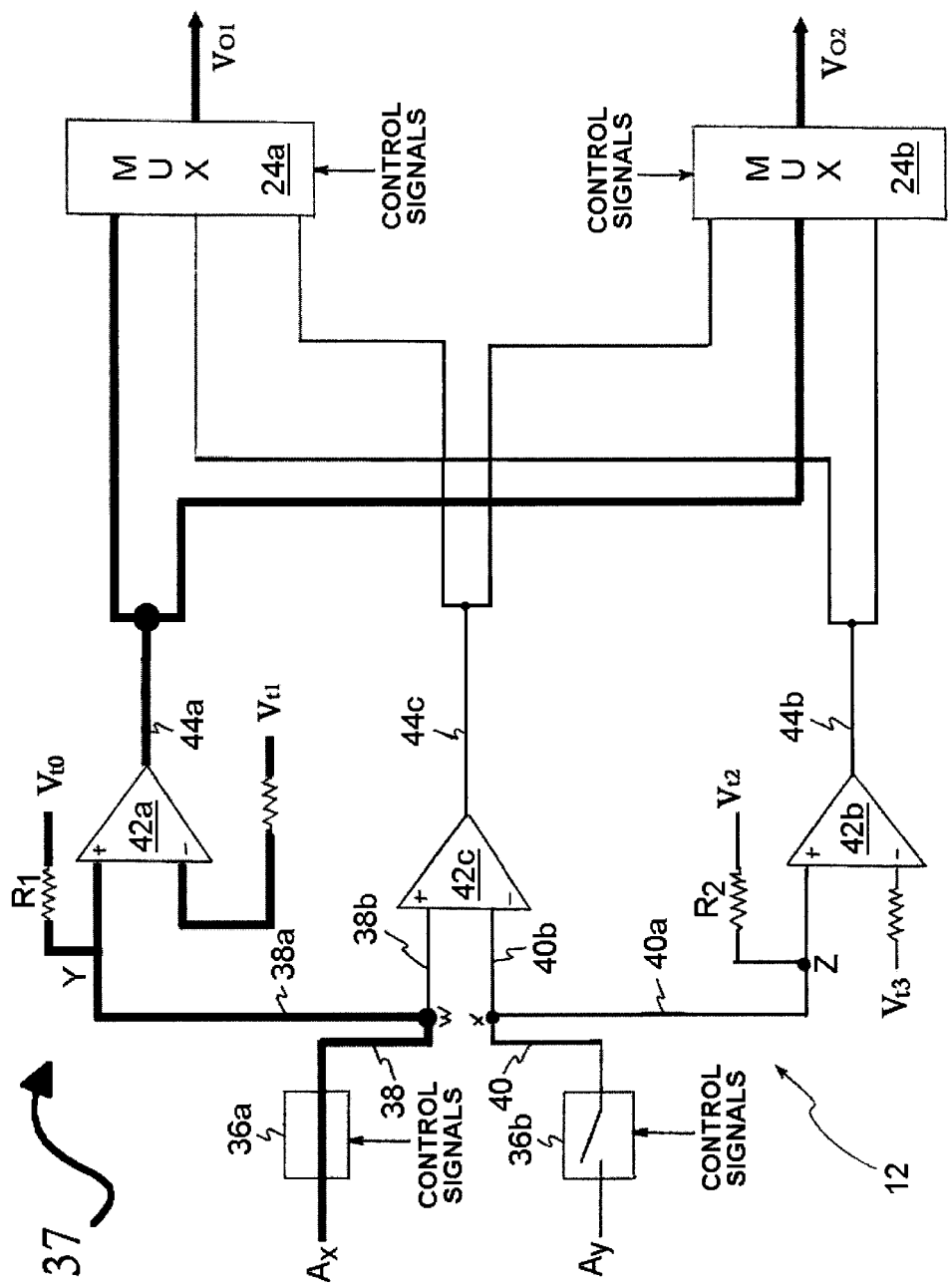
FIGS. 4 through 6, respectively, illustrate an additional exemplary embodiment of input circuitry for use with a time measurement device in accordance with the presently disclosed technology. Each of FIGS. 4 through 6 illustrates a different exemplary measurement mode in accordance with the present subject matter.
Figure 5:
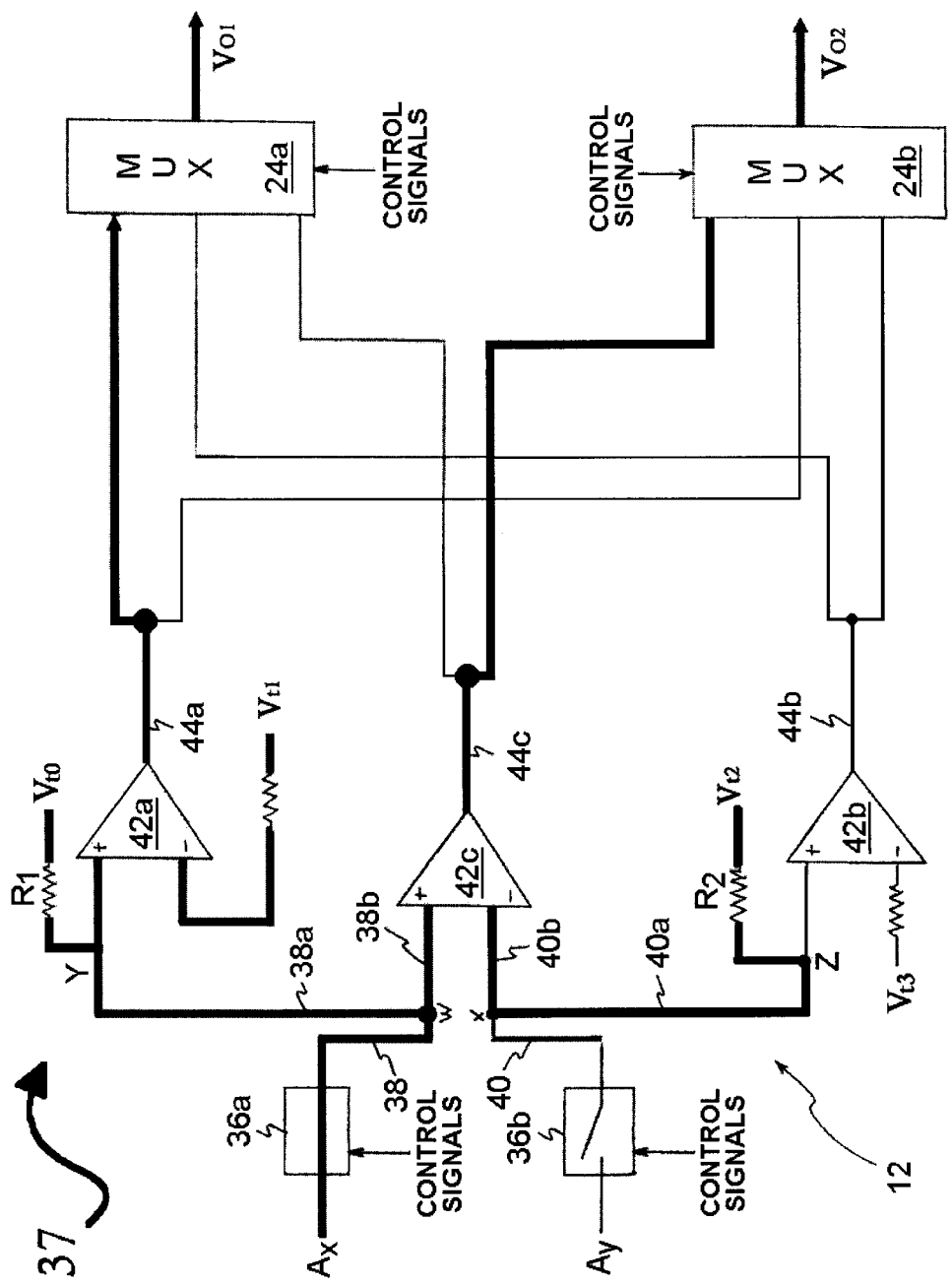
Figure 6:
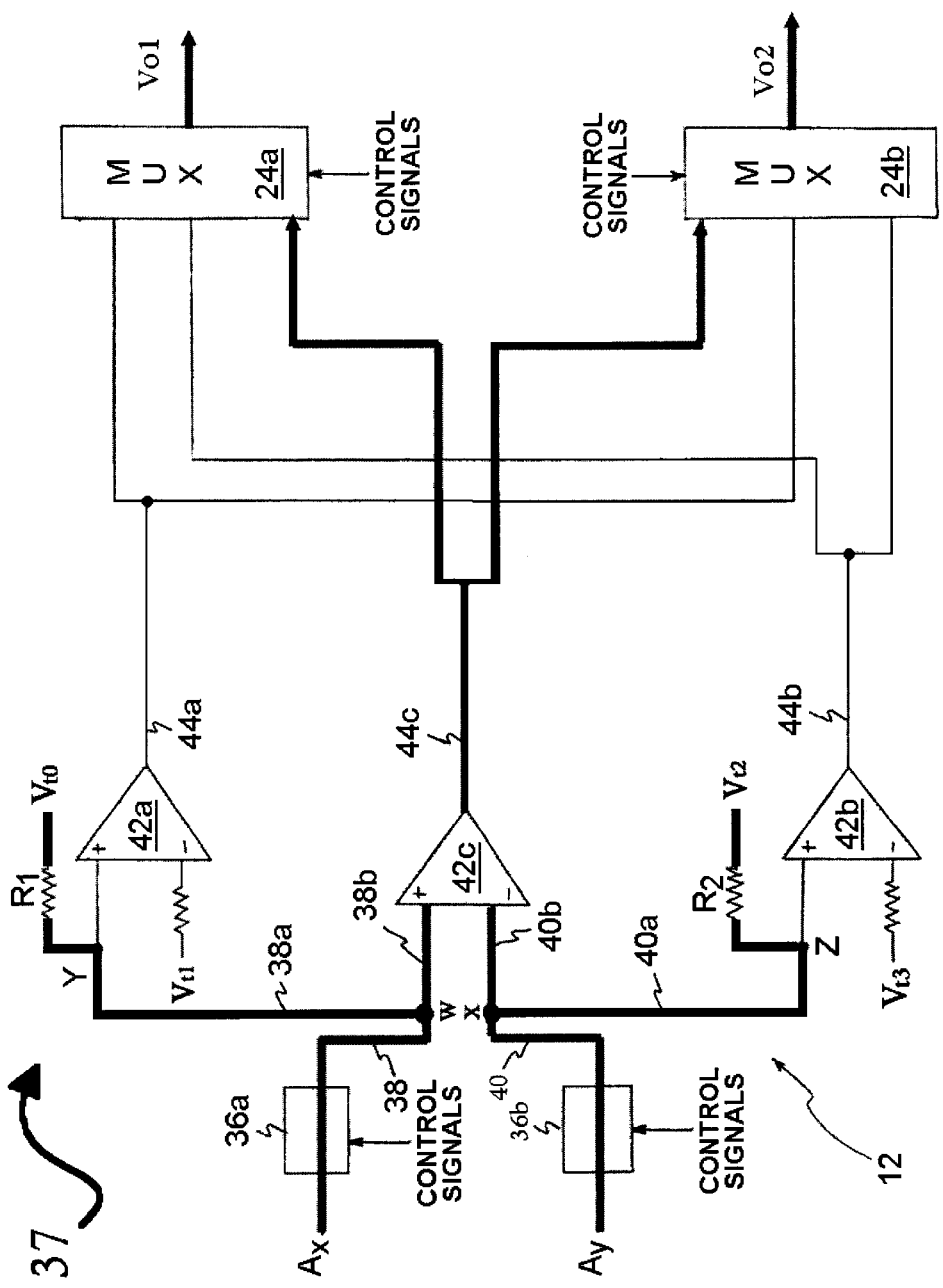
Figure 7:
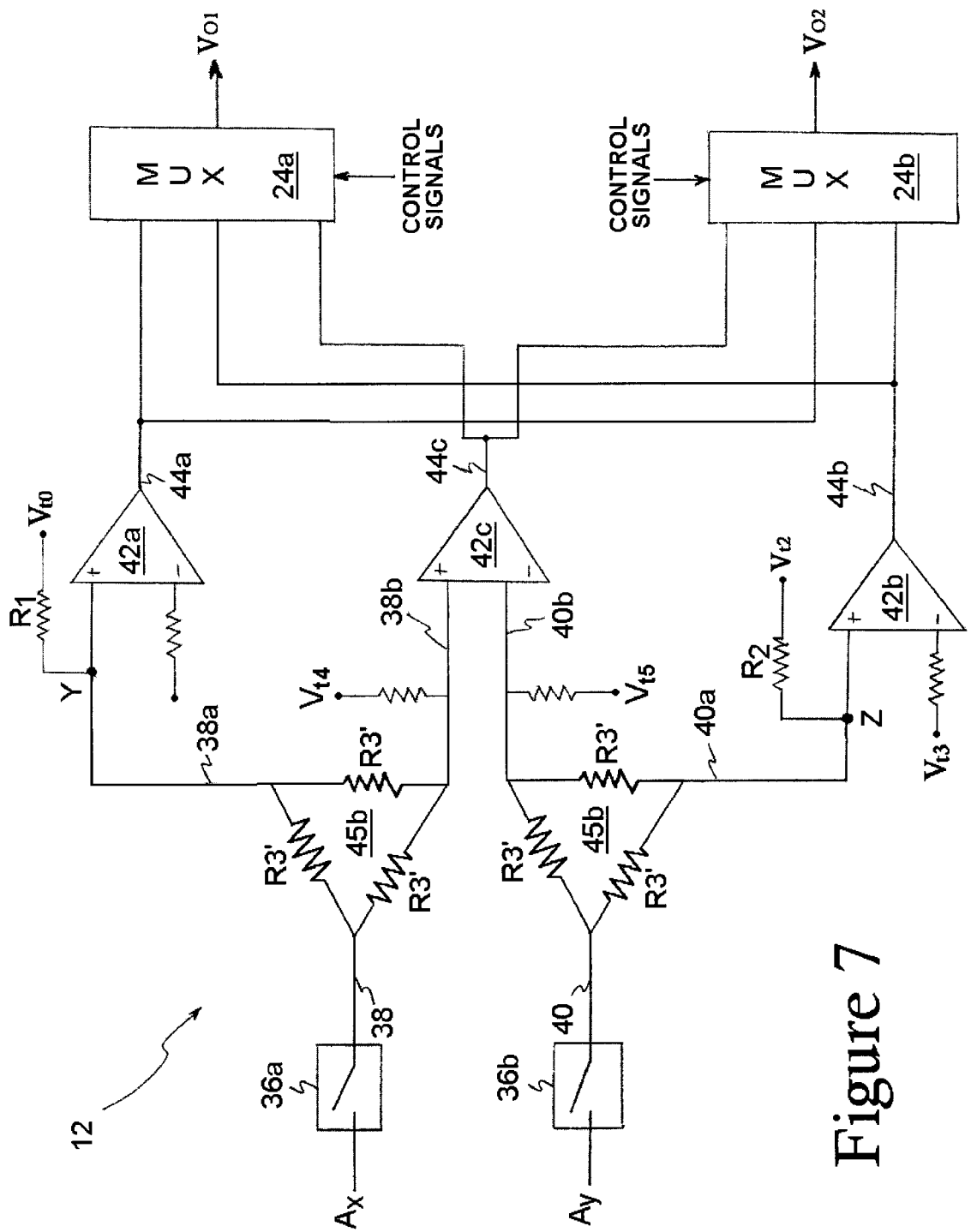
FIG. 7 illustrates a still further exemplary embodiment of input circuitry for use with a time measurement device in accordance with the presently disclosed technology.

The presently disclosed technology, discussed with reference to FIGS. 3 through 7, respectively, provides input circuitry that enables a variety of measurement modes for both single-ended and differential signals within a single hardware embodiment. FIG. 3 illustrates a first exemplary embodiment of such input circuitry, utilizing a five-comparator configuration. FIGS. 4 through 6, respectively, illustrate an additional embodiment of such input circuitry with a three-comparator configuration, offering reduced part count and versatile component utilization. FIG. 7 displays a still further exemplary embodiment of such input circuitry, including a three-comparator configuration with an isolation resistor network. These exemplary embodiments of the present technology will be discussed hereafter to illustrate how both single-ended and differential signals can be measured using the same time measurement device.

Now with reference to the drawings, FIG. 1 displays an exemplary time measurement device 10 with single-ended input signals $A_{in}$ and $B_{in}$. These two respective single-ended inputs are provided to a time measurement device 10 with two parallel measurement channels, indicated at 12 and 14. A more general time measurement device may be characterized by only one measurement channel, but multiple measurement channels allow for measuring multiple input signals with a single device. Each channel includes a control computer 16, for example a 200 MHZ DSP processor, with associated memory 18, for example a high-performance FIFO memory, and a logic circuit 20. Alternatively, the channels may share a common computer, memory, and logic circuit. Each of channels 12 and 14 preferably includes parallel measurement circuits having comparators 22a and 22b, multiplexers 24a and 24b, and interpolators 26a and 26b. Thus, each channel preferably includes multiple, and in this exemplary case—two, measurement circuits. An arming circuit 28 is controlled by computer 16 to trigger the interpolators. A continuous time counter 30 and continuous event counter 32 provide time and event counts to both channels 12 and 14. Alternatively, each measurement circuit may have its own time counter and event counter. In some cases though, this may require that the respective counters for each measurement circuit are synchronized.

Time measurement device 10, illustrated in both FIGS. 1 and 2 and briefly described above, is presented merely as an example of one type of measurement device that single-ended and/or differential signals may be inputted to. The operation of this exemplary time measurement device is not fundamental to the present subject matter, and thus additional details regarding the operation of time measurement device 10 are not presented herein. An example of the operation of such a time measurement unit may be found in U.S. Pat. No. 6,091,671, issued to Kattan and assigned to Guide Technology, Inc., applicants' assignee, which discloses a time interval analyzer with components such as those displayed in FIGS. 1 and 2. The disclosure of this patent is herein fully incorporated by reference for all purposes. It should be appreciated that the presently disclosed technology may be used in accordance with measurement hardware other than time measurement device 10 as depicted in FIGS. 1 and 2. Other measurement systems or testing equipment may provide different configurations that can still utilize aspects of the subject input circuitry and corresponding methodology for measuring both single-ended and differential input signals in accordance with the present technology.

Another example of a time measurement device that could incorporate aspects of the disclosed technology is found in U.S. Pat. No. 6,194,925, issued to Kimsal et al. and herein fully incorporated for all purposes by reference. The '925 patent discloses a time interval measurement system in which a voltage differential across a hold capacitor generated between events occurring in an input signal determines the time interval between events. The measurement system of the '925 patent utilizes a linear ramp generating circuit to ensure a linear discharge of the capacitor for easier measurement of the occurrence of the events.

Still another suitable time measurement device that may be used with aspects of the present technology is found in U.S. Pat. No. 4,757,452, issued to Scott, et al. and herein fully incorporated for all purposes by reference. The '452 patent provides a system for measuring timing jitter of a tributary data stream that has been multiplexed into a higher-rate multiplex stream using pulse stuffing techniques. The '425 patent is an event counter based system that does not directly measure time intervals but determines their frequency by maintaining a continuous count of the number of pulses occurring within a signal.

Referring again to FIG. 1, one single-ended signal is inputted to each measurement channel of time measurement device 10. Single-ended input $A_{in}$ is directed on a signal line 34 to the positive inputs of comparators 22a and 22b. Single-ended input $B_{in}$ is similarly directed to input channel 14, and it should be appreciated that a greater or fewer number of measurement channels may be employed in accordance with exemplary time measurement device 10. The following discussion will be directed primarily to measurement channel 12, and it should be understood that the construction and operation of other measurement channels is preferably the same.

Each measurement channel provides input circuitry 15 to which an input signal is provided before actually being measured. In the exemplary measurement channel 12 of FIG. 1, signal $A_{in}$ must pass through input circuitry embodied by comparators 22a and 22b and multiplexers 24a and 24b before being sent to respective interpolators 26a and 26b and other components in the measurement circuitry. Improved input circuitry is an object of the present subject matter, and thus additional description of the operation of the input circuitry 15 is hereafter presented.

Each comparator 22a and 22b of input circuitry 15 compares single-ended input $A_{in}$ to reference voltages $V_{REF1}$ and $V_{REF2}$, respectively, so that the output of each comparator changes state as $A_{in}$ moves above and below the reference voltage. Comparators 22a and 22b output binary signals with rising edges at the rising edges of $A_{in}$. The output of each comparator 22a and 22b is preferably directed to each of multiplexers 24a and 24b. Each multiplexer may have several inputs, and the selected output is determined by user input to control computer 16. For purposes of additional discussion, the selected output of multiplexer 24a is signal $V_{O1}$ and the selected output of multiplexer 24b is $V_{O2}$.

The values of $V_{REF1}$ and $V_{REF2}$ depend, generally, on the construction of the comparators and the voltage levels of the input signal. For example, the voltage level of input signal $A_{in}$ may vary between two volts (representing a logical "0") and three volts (representing a logical "1".) In such a case, it may be beneficial to set reference voltages $V_{REF1}$ and $V_{REF2}$ to some values within the two to three volt range, such as the midpoint, 2.5 volts.

The reference voltages $V_{REF1}$ and $V_{REF2}$ may also, however, vary from each other. This scenario may be particularly useful in calculating the rise time or fall time of an input signal, wherein the rise time is defined as the time it takes for the input signal to go from a specified low value to a specified high value. For example, consider an input signal with a peak voltage of 1 volts. One exemplary measure of rise time could be taken by setting $V_{REF1}$ to 0.25 volts and $V_{REF2}$ to 0.75 volts, and obtaining the time difference of measurements taken on the outputs of comparators 22a and 22b.

There are a variety of different measurements that may be obtained in accordance with the measurement circuitry provided in time measurement device 10, and the present subject matter should in no way be limited to use with measurement circuitry that obtains some particular type or types of measurements. Examples of the types of signal measurements that may be obtained with such hardware include, but are not limited to, rise time, fall time, pulsewidth, period, frequency, duty cycle, time interval error, and other characteristics that may reflect timing errors or frequency changes in a signal.

Now consider the exemplary time measurement device of FIG. 2. The measurement circuitry of time measurement unit 10 of FIG. 2 is generally the same as the measurement circuitry of FIG. 1 for purposes of illustration. However, as FIG. 1 depicts single-ended input signals to time measurement device 10, FIG. 2 illustrates a time measurement device 10 with differential input signals. Two signals $A_x$ and $A_y$ are preferably inputted to first measurement channel 12 while signals $B_x$ and $B_y$ are inputted to second measurement channel 14. Each input signal is referenced against the other signal inputted to its measurement channel. For example, comparator 22a determines aspects of the relationship between $A_x$ and $A_y$. The output of comparator 22a should be high when $A_x$ is greater than $A_y$, and low when $A_x$ is less than $A_y$. Many different types of measurements may be made on the measurement channels corresponding to signal characteristics of the differential signal inputs $A_x$ and $A_y$ of FIG. 2.

As mentioned in the Background of the Invention, past measurement devices such as time measurement device 12 have typically been hard-wired during their manufacture for measurement of either single-ended signals, as represented in FIG. 1, or differential signals, as represented in FIG. 2. The present subject matter provides a way to measure both single-ended and differential signals with the same measurement circuitry. The disclosed new input circuitry also facilitates a variety of measurement modes by enabling the measurement of single-ended signals against either one or two different threshold voltages.

FIG. 3 displays a first exemplary embodiment of the present subject matter, providing input circuitry 35 capable of receiving either single-ended or differential input signals. The input circuitry 35 of FIG. 3 could replace the input circuitry 15 of FIGS. 1 and 2 to take measurements of both single-ended and differential input signals using a single time measurement device 10. Referring to FIG. 3, two signal inputs $A_x$ and $A_y$ are directed to input circuitry 35. When single-ended signal measurements are desired, either $A_x$ or $A_y$ could be a single-ended input, and when differential signal measurements are desired, both $A_x$ and $A_y$ input signals are utilized to provide a single differential pair.

The fundamental selection of single-ended or differential measurement modes is done with control signals provided to multiplexers 24a and 24b. However, as can be seen in FIG. 3, electromechanical relays 36a and 36b are serially provided in the path of each respective input signal $A_x$ and $A_y$. The function of these relays is to connect or disconnect the time measurement unit from the overall test setup. Many tests, including timing related tests and non-timing related tests, are generally being carried out in the course of testing a semiconductor chip. Relays 36a and 36b are preferably opened to disconnect the time measurement device from the overall test setup while such other measurements are being taken.

There are many types of relays that can be used for selectively providing inputs $A_x$ and $A_y$ to the time measurement device. For example, relays 36a and 36b may comprise simple direct-path relay switches that preferably introduce minimal distortion to the input signal. Alternatively, relays 36a and 36b could be replaced by resistive coupling that provides isolation for the time measurement device from the remaining test setup. Yet another alternative for selecting the connection status of the time measurement device is to connect or disconnect the device from a test setup by toggling relays located on a loadboard containing the actual device under test.

To demonstrate the use of relays 36a and 36b in accordance with the present subject matter, suppose a user wishes to obtain measurements for a single-ended signal directed to the $A_x$ input path. Then control signals are provided to relays 36a and 36b to toggle relay 36a closed and relay 36b open. Alternatively, a single-ended input signal could be provided at $A_y$, whereby relay 36b should be toggled closed and relay 36a should be toggled open. If a user wishes to obtain measurements for a differential signal, then that signal is preferably provided on both signal inputs $A_x$ and $A_y$ while the appropriate control signals toggle both relays 36a and 36b to closed positions.

When both relays 36a and 36b are closed, input signals $A_x$ and $A_y$ propagate along signal paths 38 and 40, respectively, to selected of a plurality of comparitors, 42a, 42b, 42c, 42d, and 42e. Comparators 42a and 42b are provided in accordance with obtaining single-ended signal measurements of input $A_x$, while comparators 42d and 42e are provided in accordance with obtaining single-ended signal measurements of input $A_y$. Comparator 42c is provided in accordance with obtaining differential signal measurements of a differential input $A_x$ and $A_y$. When relay 36a is toggled closed, the $A_x$ input signal propagates along signal path 38, splitting at node W and connecting to the positive inputs of comparators 42a, 42b, and 42c. When relay 36b is toggled closed, the $A_y$ input signal propagates along signal path 40, splitting at node X and connecting to the negative input of comparator 42c and the positive inputs of comparators 42d and 42e.

Comparator inputs that do not receive input signals $A_x$ or $A_y$ may receive a signal from a programmable voltage source. A programmable voltage source in accordance with the present subject matter is a voltage source that can be set to any number of given voltage levels based on user input or default software-implemented definition. Programmable voltage sources utilized in the exemplary embodiment of FIG. 3 include termination voltage sources $V_{t0}$ and $V_{t5}$ and threshold voltage sources $V_{t1}$, $V_{t2}$, $V_{t3}$, and $V_{t4}$.

The function of comparators 42a through 42e, respectively, will vary depending on the type of input signal (single-ended or differential) and the type of desired measurement mode (comparison against the same or different threshold voltage levels). These various options and additional details regarding the operation of input circuitry 35 are hereafter presented.

A first measurement mode that may be enabled through incorporation of input circuitry 35 with an appropriate time measurement device is the comparison of a single-ended input signal against a single threshold voltage level. The discussion of this measurement mode will be primarily directed towards the measurement of single-ended input $A_x$, but it should be appreciated that similar measurements and input circuitry can be obtained for single-ended input $A_y$. For example, comparison of single-ended $A_y$ input to a single threshold voltage could be done with comparator 42d or 42e.

Consider $A_x$ as a single-ended input signal provided to the input circuitry 35 of a time measurement device, and that timing measurements corresponding to the rising edges of input signal $A_x$ are desired. The rising edges of $A_x$ can be located by comparing $A_x$ to a threshold voltage via comparator 42a. Whenever the voltage level of signal $A_x$ is greater than the given threshold voltage, then a comparator output goes high, outputting a voltage representing a logical "1," for example positive two volts. Alternatively, any time that the voltage level of signal $A_x$ is less than the given threshold voltage inputted to a given comparator, the comparator output goes low, outputting a voltage representing a logical "0," for example, negative two volts. A comparator output signal, comprising some sequence of logical "0"s and "1"s, will hereafter be referred to as a timing signal, since it is representative of the times that an input signal crosses above or below the given threshold level.

Consider input signal $A_x$ with a peak voltage of one volt. In such an exemplary scenario, it may be beneficial to define a rising edge of $A_x$ as the point that $A_x$ crosses the midpoint of the peak voltage, or half a volt. A timing signal that defines the rising edges of $A_x$ could be generated either at comparator 42a by connecting $A_x$ and $V_{t1}$ to the inputs of comparator 42a or at comparator 42b by connecting $A_x$ and $V_{t2}$ to the inputs of comparator 42b. If comparator 42a is used to create a timing signal based on input $A_x$, then relay 36a should be toggled shut and threshold voltage $V_{t1}$ (a programmable voltage source) should be set to a given level, for example a half a volt.

$A_x$ is preferably connected to comparators 42a through 42c, respectively, through termination resistor R1, and $A_y$ is preferably connected to comparators 42c through 42e, respectively, through termination resistor R2. The resistance values of termination resistors R1 and R2 are typically selected to match the input impedance of the measurement circuits to the impedance of the input signals. Input signals are typically delivered through coaxial cables, often characterized by an input impedance of about 50 Ω, in which case 50 Ω would be a preferable value for termination resistors R1 and R2. Alternatively, such termination resistors could be programmable over a predetermined range of resistor values to facilitate impedance matching over a wide range of input source impedances. Matching the input impedance of the measurement circuit to the impedance of the input signal source helps minimize input signal reflections which might cause significant overshoot, undershoot, and/or steps on pulse edges. Threshold voltages $V_{t1}$, $V_{t2}$, $V_{t3}$, and $V_{t4}$ are preferably connected to their respective comparators through a series resistor with an impedance value similar to that of termination resistors R1 and R2 to allow for more accurate operation of comparators 42a through 42e, respectively.

The termination resistors R1 and R2 are respectively connected to termination voltage sources $V_{t0}$ and $V_{t5}$. $V_{t0}$ and $V_{t5}$ are programmable voltage sources, often set to zero or a ground reference, but possibly set to some other voltage level. As opposed to programming $V_{t0}$ and $V_{t5}$ to ground, they can be programmed to values closer to selected of the threshold voltages so that selected comparator output signals yield a smaller voltage transition between the output value representing logical "0" and the output value representing logical "1." A minimized difference between a terminal voltage, such as $V_{t0}$, and a threshold voltage, such as $V_{t1}$, provides a time measurement system with enhanced reaction time for measuring the transition edges of higher frequency signals.

Independent of the type of input signal and the selected measurement mode for a given time measurement, each input to a utilized comparator is preferably provided with an appropriate termination resistance. To enable the measurement of a single-ended input signal $A_x$ compared against a single threshold voltage $V_{t1}$, control signals to multiplexers 24a and 24b select the output signal on line 44a as both multiplexer outputs Vo1 and Vo2. It should be appreciated that alternative combinations of a single comparator and single threshold voltage may be used to take a measurement of inputs $A_x$ or $A_y$.

Continuing with the exemplary embodiment of FIG. 3, another measurement mode enabled by the incorporation of input circuitry 35 with an appropriate time measurement device is the comparison of a single-ended input signal against two different threshold voltage levels. In the case of measuring single-ended input $A_x$ with comparison against different threshold voltages, both comparators 42a and 42b are utilized. Relay 36a should be toggled closed such that $A_x$ is directed to the positive inputs of comparators 42a and 42b.

The positive inputs of comparators 42a and 42b are further connected by a termination resistor R1 to programmable termination voltage source $V_{r0}$. Threshold voltage sources $V_{r1}$ and $V_{r2}$ are programmed to a desired level and connected through respective load resistors to the negative inputs of comparators 42a and 42b. As previously mentioned, comparison of a single-ended input signal against two different threshold voltages may be particularly useful when calculating the rise or fall time or other characteristic of an input signal. To select this measurement mode, control signals to multiplexer 24a select signal 44a as output Vo1 and control signals to multiplexer 24b select signal 44b as output Vo2. Alternatively, a dual threshold measurement can also be done for single-ended input $A_y$ with utilization of comparators 42d and 42e. In the case of measuring input $A_y$, control signals to multiplexers 24a and 24b preferably select signals 44d and 44e as outputs Vo1 and Vo2, resepectively.

Yet another measurement mode enabled through selected use of input circuitry 35 is differential signal comparison. In accordance with this exemplary measurement mode, input signals $A_x$ and $A_y$ are differential signals provided to input circuitry 35. For differential signal inputs, both relays 36a and 36b should be toggled closed such that input $A_x$ is connected to the positive input of comparator 42c and input $A_y$ is connected to the negative input of comparator 42c. To match the input impedance of the differential input signals to that of the measurement circuitry, the $A_x$ input to comparator 42c is preferably connected by a termination resistor R1 to termination voltage source $V_{r0}$ and the $A_y$ input to comparator 42c is preferably connected through termination resistor R2 to termination voltage source $V_{r5}$. $V_{r0}$ and $V_{r5}$ may be programmed to ground or to some other desired termination voltage level. Comparator 42c then compares the $A_x$ input to the $A_y$ input. The output of comparator 42c should be high when $A_x$ is greater than $A_y$ and low when $A_y$ is greater than $A_x$. To enable the differential signal comparison measurement mode, control signals to multiplexers 24a and 24b select signal 44c as the respective multiplexer outputs Vo1 and Vo2.

As previously mentioned with regards to the subject technology, differential signals are often utilized since they offer many advantages. Thus, it may be desirable with respect to certain applications to incorporate differential signaling technology within a time measurement unit and its corresponding signal processing circuitry. In such cases then, each comparator output signal 44a, 44b and 44c may actually comprise a differential signal that is equal to the difference in a comparator output and its inverse. Thus, timing information that is delivered to multiplexors 24a and 24b and then to respective measurement circuits of a time measurement device may be transmitted as a differential signal pair, thus minimizing the common mode noise effects within the input circuit.

The control signals provided to multiplexers 24a and 24b determine which of three types of measurement modes for two different types of input signals are to be measured by the interpolators of a time measurement device. These control signals may be from control computer 16 and can be variably user-defined or preprogrammed to some default. Programming the control signals to operate multiplexers 24a and 24b should be understood by one in the art and is thus not discussed in detail herein. Outputs Vo1 and Vo2 may be sent to different interpolators within the same measurement channel or to different measurement channels altogether.

Many different types of measurements can be obtained in accordance with exemplary input circuitry 35 of FIG. 3. However, the efficiency of this five-comparator input circuit configuration can be further improved. By recognizing that certain electronic components can be shared by other components, a different exemplary embodiment of input circuitry for both single-ended and differential input signals is enabled. An additional exemplary embodiment of input circuitry in accordance with the present subject matter is provided in FIGS. 4 through 6 respectively.

Referring to FIG. 4, exemplary input circuitry 37 can provide both single-ended and differential input signals to a time measurement device while enabling a variety of different measurement modes. In particular, input circuitry 37 provides the same input circuitry capabilities as input circuitry 35 of FIG. 3 with a fewer number of components. Input circuitry 37 needs only four programmable voltage sources as opposed to the six voltage sources in input circuitry 35. In addition, exemplary input circuitry embodiment 37 also employs a three-comparator configuration as opposed to a five-comparator configuration. One of the major features enabling such reduced component part is the utilization of programmable voltage sources as either threshold voltage sources or termination voltage sources depending on the measurement mode selected by the user. The following discussion with respect to FIGS. 4 through 6 describes how input circuitry 37 is used to enable the measurement modes already discussed with reference to FIG. 3. Particular exemplary signal paths in FIGS. 4 through 6, respectively, are represented by bold signal lines and are intended to represent the measurement mode discussed with reference to each figure.

FIG. 4 illustrates how input circuitry 37 can be used to enable the measurement of a single-ended input against a single threshold voltage. Although the input signal could be $A_x$ or $A_y$, this discussion primarily focuses on the input $A_x$ with the appreciation that a similar measurement may be obtained with input $A_y$ and other input circuitry components. For this measurement mode, relay 36a should be toggled closed and relay 36b toggled open by way of the software selectable control signals provided to the relays. Input $A_x$ is then connected to the positive inputs of comparators 42a and 42c. Since relay 36b is open, and provided that no signal is provided by source $V_{r2}$, no signal is provided to the negative input of comparator 42c and thus this comparator is effectively inactive for this particular measurement mode. Programmable voltage source $V_{r1}$ is connected through a load resistor to the negative input of comparator 42a to serve as a threshold voltage. Programmable voltage source $V_{r0}$ is connected through termination resistor R1 to the $A_x$ input of comparator 42a to serve as a termination voltage source. Comparator 42a outputs a timing signal 44a based on the comparison of input $A_x$ to threshold voltage $V_{r1}$, and the timing signal is then preferably directed to both multiplexers 24a and 24b. In this measurement mode, control signals provided to multiplexers 24a and 24b preferably select timing signal 44a as the respective $V_{O1}$ and $V_{O2}$ mux output signals.

FIG. 5 illustrates how input circuitry 37 can be used to enable the measurement of a single-ended input against two different threshold voltages. Although the input signal could be $A_x$ or $A_y$, this discussion primarily focuses on the input $A_x$ with the appreciation that a similar measurement may be obtained with input $A_y$ and other input circuitry components. For this measurement mode, relay 36a should be toggled closed and relay 36b toggled open by way of the software selectable control signals provided to the relays. Input $A_x$ is then connected to the positive inputs of comparators 42a and 42c. Each of these inputs is preferably terminated by resistor R1 and termination voltage source $V_{r0}$, which is employed as a termination voltage source. Programmable voltage source $V_{t1}$ is connected through a load resistor to the negative input of comparator 42a to serve as a first threshold voltage. Programmable voltage source $V_{t2}$ is connected through a load resistor to the negative input of comparator 42c to serve as a second threshold voltage. In this case, $V_{t1}$ and $V_{t2}$ are typically programmed to different threshold levels, for instance such as levels required to calculate the rise time of input $A_x$. Comparator 42a outputs a timing signal 44a based on the comparison of input $A_x$ to threshold voltage $V_{t1}$, while comparator 42c outputs a timing signal 44c based on the comparison of input $A_x$ to threshold voltage $V_{t2}$. Both timing signals 44a and 44c are then preferably directed to both multiplexers 24a and 24b. In this measurement mode, control signals provided to multiplexers 24a and 24b preferably select timing signal 44a as mux output signal $V_{O1}$ and timing signal 44c as mux output signal $V_{O2}$. Another preferable software selection would be to select timing signal 44c as mux output $V_{O1}$ and timing signal 44a as output signal $V_{O2}$.

FIG. 6 depicts how input circuitry 37 can be used to enable the measurement of a differential signal input. For this measurement mode, relays 36a and 36b should be toggled closed by way of the software selectable control signals provided to the relays. Input $A_x$ is thus connected to the positive input of comparator 42c and input $A_y$ is connected to the negative input of comparator. Programmable voltage source $V_{t0}$ is connected by a termination resistor R1 to the $A_x$ input of comparator 42c to serve as a termination voltage source. Also, programmable voltage source $V_{t2}$ is connected by a termination resistor R2 to the $A_y$ input of comparator 42c to serve as a termination voltage course. Comparator 42c outputs a timing signal 44c based on the comparison of differential input $A_x$ to differential input $A_y$, and the timing signal is then preferably directed to both multiplexers 24a and 24b. In this measurement mode, control signals provided to multiplexers 24a and 24b preferably select timing signal 44c as the respective $V_{O1}$ and $V_{O2}$ mux output signals.

Yet another exemplary embodiment of the present technology is illustrated in FIG. 7 and combines the three-comparator input circuitry embodiment of FIGS. 4, 5, and 6 with isolation resistor networks 45a and 45b. These resistive networks are included in signal paths 38 and 40 to help maintain the signal integrity of input signals $A_x$ and $A_y$. Input $A_x$ is selectively applied through relay 36a to one of three nodes in the delta-shaped resistor network 45a. Signals 38a and 38b are then taken from the other two respective nodes in the delta-shaped resistor network 45a and transmitted to respective comparators 42a and 42c. Signal 38a is connected to a termination voltage $V_{t0}$ through termination resistor R1 and signal 38b is connected to termination voltage $V_{t4}$ through termination resistor R4. Similarly, input signal $A_y$ is applied to exemplary resistor network 45b before its input to comparators 42c and 42b. Signal 40a is connected to a termination voltage $V_{t2}$ through termination resistor R2 and signal 40b is connected to termination voltage $V_{t5}$ through termination resistor R5.

Each exemplary configuration of resistor networks 45a and 45b, as presented in FIG. 7, comprises three resistors. The resistance values of R3 and R3' are all preferably similar, and chosen appropriately with respect to the resistance values of termination resistors R1 and R2. Delta-shaped resistor networks 45a and 45b may be substituted with Y-shaped resistor networks, while still providing effective isolation for the input signals. In such case, the resistance values of R3 and R3' may also be chosen with respect to the resistance values of termination resistors R1 and R2, or determined by delta-wye conversion techniques as should be readily known by one of ordinary skill in the art.

The equivalent resistance of network 45a offers improved isolation of the input signal on path 38 from the input impedance (especially capacitive components) of comparators 42a and 42c. Similarly, resistor network 45b offers improved isolation of the input signal on path 40 from the input impedance of comparators 42c and 42b. Although the presence of resistor networks 45a and 45b enhances the performance of input circuit 12, especially at very high frequencies, there is attenuation of the input signals $A_x$ and $A_y$ before their input to respective comparators. Therefore, the inclusion of resistor networks 45a and 45b in input circuitry 12 may be preferred only when a lower effective input signal voltage is acceptable.

Thus, three exemplary embodiments of input circuitry for use in accordance with time measurement devices have been disclosed. These embodiments enable varied measurements of both single-ended and differential signals inputted to a time measurement device. While the presently disclosed technology has been described in detail with respect to specific embodiments thereof, it will be appreciated that those skilled in the art, upon attaining an understanding of the foregoing may readily conceive of alterations to, variations of and equivalents to these embodiments. Accordingly, the scope of the present subject matter should be assessed as that of the appended claims and any equivalents thereto.

What is claimed is:

1. A measurement device capable of measuring both single-ended signal inputs and differential signal inputs, wherein said measurement device comprises at least one measurement channel having respective measurement circuitry for obtaining signal information about selected input signals as well as input circuitry for selecting the input signals for which to obtain signal information, said respective input circuitry comprising:

at least three dual-input comparators, wherein input signals are selectively provided to both comparator inputs and a comparator output signal is provided from each of said at least three comparators;

a plurality of selection devices, each receiving a comparator output signal from each of said at least three dual-input comparators, and each outputting a selected signal to said respective measurement circuitry based on software selection inputs to the plurality of selection devices.

2. A measurement device as in claim 1, wherein two of said at least three comparators receive a respective variable data signal and a respective common voltage signal as their two inputs, and one of said at least three comparators receives two variable data signals as its inputs.

3. A measurement device as in claim 2, wherein each of said variable data signals received by said comparators is selectively provided by means of a switching mechanism positioned before the comparator input to which it is connected.

4. A measurement device as in claim 2, wherein said plurality of selection devices comprise multiplexors receiving input signals and control signals, wherein the input signals correspond to the comparator output signals and the control signals correspond to the software selection inputs.

5. A measurement device as in claim 2, wherein each of said comparator inputs that receives a variable data signal is linked to an additional voltage source and termination resistor to help retain signal integrity of said data signals.

6. A measurement device as in claim 5, wherein each common voltage signal applied to an input comparator that receives a respective data signal and a common voltage signal as its two inputs is passed through a load resistor with a selected resistance value that generally matches the resistance value of the termination resistor linked to the variable data signal inputted to the same comparator.

7. A measurement device as in claim 6, wherein each of said comparator inputs that receives a variable data signal is linked to an additional common voltage signal and termination resistor to help retain signal integrity of the variable data signals.

8. A measurement device as in claim 7, wherein each common voltage signal applied to an input comparator that receives a respective data signal and a common voltage signal as its two inputs is passed through a load resistor with a selected resistance value that generally matches the resistance value of the termination resistor linked to the variable data signal inputted to the same comparator.

9. A measurement device as in claim 1, comprising five comparators, four of which receive a respective variable data signal and a respective common voltage signal as their two inputs, and one of which receives two variable data signals as its inputs.

10. A measurement device as in claim 9, wherein said plurality of selection devices comprises multiplexors receiving input signals and control signals, wherein the input signals correspond to the comparator output signals and the control signals correspond to the software selection inputs.

11. A measurement device as in claim 1, further comprising a resistor network between each signal input and said plurality of comparators such that a variable data signal inputted to a selected comparator through said resistor network is isolated from the input impedance of selected comparators in the input circuitry.

12. A measurement device as in claim 1, wherein each of said comparator output signals comprises a differential signal pair corresponding to the actual comparator signal and its inverse.

13. Input circuitry to facilitate the receipt of both single-ended and differential input signals, said input circuitry comprising:
   at least first, second, and third comparators, wherein each of said comparators is characterized by two input terminals for receiving comparator input signals and one output terminal for providing a comparator output signal;
   a plurality of multiplexors, wherein each of said multiplexors receives a plurality of multiplexor input signals and a plurality of multiplexor control signals and wherein each of said multiplexors also provides a single multiplexor output signal;
   wherein a first input signal is selectively connected to one input terminal of said first comparator and also selectively connected to one input terminal of said second comparator;
   wherein a second input signal is selectively connected to one input terminal of said second comparator and also selectively connected to one input terminal of said third comparator;
   wherein said multiplexor input signals for each of said plurality of multiplexors comprise a comparator output signal from said first comparator, a comparator output signal from said second comparator, and a comparator output signal from said third comparator;
   wherein each multiplexor output signal is selected by the respective multiplexor control signals such that either single-ended or differential signals are provided.

14. Input circuitry as in claim 13, wherein said first input signal is connected to said first and second comparators through a resistive network to isolate said first input signal from input impedance of said first and second comparators.

15. Input circuitry as in claim 13, wherein said multiplexor input signals for each of said plurality of multiplexors further comprise the inverse of the comparator output signal from said first comparator, the inverse of the comparator output signal from said second comparator, and the inverse of the comparator output signal from said third comparator.

16. Input circuitry as in claim 13, further comprising a plurality of common voltage sources wherein each common voltage source provides programmable voltage level, and wherein selected of said plurality of common voltage sources are connected to selected inputs of said first and third comparators.

17. Input circuitry as in claim 16, wherein additionally selected of said common voltage sources are connected in series with respective termination resistors to the respective signal paths of said first and second input signals.

18. Input circuitry as in claim 13 wherein each comparator output signal comprises a differential signal pair.

19. Input circuitry as in claim 13, further comprising fourth and fifth comparators, also each characterized by two input terminals for receiving comparator input signals and one output terminal for providing a comparator output signal, and wherein said first input signal is selectively connected to one input terminal of said fourth comparator and said second input signal is selectively connected to one input terminal of said fifth comparator.

20. Input circuitry as in claim 19, further comprising a plurality of common voltage sources wherein each common voltage source provides a programmable voltage level, and wherein selected of said plurality of common voltage sources are connected to selected inputs of said first, third, fourth, and fifth comparators.

21. Input circuitry as in claim 20, wherein additionally selected of said common voltage sources are connected in series with respective termination resistors to the respective signal paths of said first and second input signals.

22. A time measurement device for obtaining timing information about events in at least one input signal, said time measurement device comprising:
   at least one measurement channel, each of said measurement channels further comprising an input circuit for receiving said at least one input signal and for outputting a timing signal based on the selected events in the input signal;
   a plurality of interpolators, wherein each of said interpolators receives a timing signal from a selected input circuit and obtains measurements corresponding to selected transitions within its received timing signal, and whereby each interpolator provides information about such measurements to other components in said time measurement device for recording the measurement information; and
   wherein each of said measurement channels and corresponding input circuits are capable of transitioning between single-ended and differential measurement modes as directed by control inputs from a user.

23. A time measurement device as in claim 22, wherein each of said input circuits further comprises:
   two parallel input paths, wherein each of said input paths has a relay therein for allowing or hindering the propagation of said at least one input signal along said input paths;
   two single-ended comparators and one differential comparator, wherein each of said comparators receives at least one input signal and outputs a timing signal indicative of selected rising and falling edges of said at least one input signal; and at least one selection mechanism connecting all comparator outputs to selected of said interpolators for choosing which timing signal is to be measured by each respective interpolator.

24. A time measurement device as in claim 23, wherein timing signal outputs from each comparator are transmitted through said at least one selection mechanism to selected of said interpolators as a differential signal pair, said differential signal pair comprising a timing signal and its corresponding inverse.

25. A time measurement device as in claim 24, further comprising resistor networks after each of said two parallel input paths and before said comparators such that an input signal to a comparator is more isolated from the input impedance of selected components in said input circuitry.

26. A time measurement device as in claim 23, wherein at least one input terminal of each of said comparators is connected through a resistor to a programmable voltage source.

27. A time measurement device as in claim 26, wherein selected of said pre-defined voltage sources function as threshold voltages during single-ended measurement modes.

28. A selection method for determining whether measurement circuitry is to obtain timing measurements corresponding to single-ended input signals or to differential input signals, said method comprising the following steps:

selectively providing at least two input signals to a plurality of comparators, wherein each of said plurality of comparators is characterized by first and second inputs and an output;

providing a plurality of programmable voltage sources to each first and second input of said plurality of comparators that are not selectively connected to one of the two input signals; and providing a plurality of selection devices, each for receiving comparator outputs from selected of said plurality of comparators and for receiving user-defined input for determining which of the received comparator outputs will be sent to the measurement circuitry such that timing measurements related to such comparator outputs can be obtained;

wherein selected of said plurality of programmable voltage sources are utilized as threshold voltage inputs to selected of said plurality of comparators.

29. A selection method as in claim 28, wherein selected of said plurality of programmable voltage sources are utilized as termination voltage sources for connecting to a plurality of input signals before the input signals are provided to a comparator.

30. A selection method as in claim 29, further comprising the step of routing each of said comparator signals and the respective inverses of each comparator signal to each of said plurality of selection devices.

* * * * *

UNITED STATES PATENT AND TRADEMARK OFFICE
CERTIFICATE OF CORRECTION

PATENT NO. : 6,701,280 B2
DATED : March 2, 2004
INVENTOR(S) : Steven Horne and Shalom Kattan It is certified that error appears in the above-identified patent and that said Letters Patent is hereby corrected as shown below:

Title page,
Item [75], Inventors, should read
-- Steven Horne, El Granada, CA (AU)
 Shalom Kattan, Campbell, CA (US) --.

Signed and Sealed this

Twenty-second Day of February, 2005

JON W. DUDAS
*Director of the United States Patent and Trademark Office*